United States Patent
Wu et al.

(10) Patent No.: US 6,861,104 B2
(45) Date of Patent: Mar. 1, 2005

(54) METHOD OF ENHANCING ADHESION STRENGTH OF BSG FILM TO SILICON NITRIDE FILM

(75) Inventors: Hsin-Chang Wu, Taipei (TW); Cheng-Yuan Tsai, Yun-Lin Hsien (TW); Yu-Wen Fang, Taipei (TW); Neng-Hui Yang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 124 days.

(21) Appl. No.: 10/063,896

(22) Filed: May 22, 2002

(65) Prior Publication Data

US 2003/0219993 A1 Nov. 27, 2003

(51) Int. Cl.$^7$ .............................. B05D 3/06; H05H 1/46; C23C 14/10; C23C 14/14; H01L 21/306; H01L 21/473

(52) U.S. Cl. .................. 427/539; 427/579; 427/255.18; 427/255.27; 427/255.37; 427/255.393; 427/255.394; 438/791; 438/792; 438/763; 438/771; 438/719; 438/723; 438/724

(58) Field of Search .................. 427/579, 535, 427/534, 255.18, 255.27, 255.37, 255.393, 255.394; 216/2, 79, 80; 438/791, 792, 761, 763, 769, 770, 771, 787, 786, 778, 706, 719, 718, 723, 724

(56) References Cited

U.S. PATENT DOCUMENTS 4,330,569 A * 5/1982 Gulett et al.
5,108,843 A * 4/1992 Ohtaka et al. ............... 428/446
5,888,855 A * 3/1999 Nagahisa et al. ............ 438/158
6,291,146 B1   9/2001 Chang et al.
6,303,466 B1 * 10/2001 Shimonishi et al. ......... 438/778
6,319,814 B1 * 11/2001 Tsai et al. .................... 438/624
6,323,139 B1 * 11/2001 Moore et al. ................ 438/786
6,380,095 B1 * 4/2002 Liu et al. ..................... 438/719
6,465,359 B2 * 10/2002 Yamada et al. .............. 438/706
6,521,300 B1 * 2/2003 Hsieh et al. ................. 427/539
2002/0158281 A1 * 10/2002 Goldbach et al. ............ 257/296
2003/0013272 A1 * 1/2003 Hong et al. .................. 438/437
2003/0064603 A1 * 4/2003 Komada ...................... 438/743
2004/0171224 A1 * 9/2004 Suzuki et al. ................ 438/301

FOREIGN PATENT DOCUMENTS

KR         20010094840 A        3/2001

* cited by examiner

Primary Examiner—Marianne Padgett
(74) Attorney, Agent, or Firm—Winston Hsu

(57) ABSTRACT

A method of enhancing adhesion strength of a boro-silicate glass (BSG) film to a silicon nitride film is provided. A semiconductor substrate with a silicon nitride film formed thereon is provided. The silicon nitride film is then exposed to oxygen-containing plasma such as ozone plasma. A thick BSG film is then deposited onto the treated surface of the silicon nitride film. By pre-treating the silicon nitride film with ozone plasma for about 60 seconds, an increase of near 50% of Kapp of the BSG film is obtained.

14 Claims, 7 Drawing Sheets

METHOD OF ENHANCING ADHESION STRENGTH OF BSG FILM TO SILICON NITRIDE FILM

BACKGROUND OF INVENTION

1. Field of the Invention

The present invention relates to a semiconductor manufacturing technique. More particularly, the present invention relates to a method of enhancing adhesion strength of a boro-silicate glass (BSG) film to a silicon nitride film. The method according to the present invention can effectively prevent peeling of the BSG film from the silicon nitride film during or after a dry etching process, and is capable of integrating with standard semiconductor manufacturing processes.

2. Description of the Prior Art

During the manufacturing of semiconductor devices, a number of film deposition and etching processes are involved. As known by those skilled in the art, adhesion property between films in a semiconductor wafer is one of the most important factors that affects yield of these devices. Please refer to FIG. 1 to FIG. 5. FIG. 1 to FIG. 5 are schematic diagrams depicting a prior art method of forming a deep trench on a semiconductor substrate 10. As shown in FIG. 1, a pad oxide layer 12 and a silicon nitride film 14 are provided on the semiconductor substrate 10. Typically, the silicon nitride film 14 is formed by using low-pressure chemical vapor deposition (LPCVD). The silicon nitride film 14 has a thickness of about 1000 to 2000 angstroms.

As shown in FIG. 2, a thick boro-silicate glass (BSG) film 16 is then deposited onto the silicon nitride film 14. The BSG film 16 is used as a hard mask film in the succeeding dry etching processes. Typically, the BSG film 16 has a thickness of about 7,500 angstroms to 15,000 angstroms and a boron concentration of about 5.5% in weight.

As shown in FIG. 3, a patterned photoresist layer 18 is coated on the BSG film 16. The photoresist layer 18 has openings 19 that define the location and pattern of deep trenches to be formed in the semiconductor substrate 10. As shown in FIG. 4, a first dry etching process is carried out to etch the BSG film 16 and the silicon nitride film 14 through the openings 19, thereby forming openings 21 in the films 16 and 14. Subsequently, as shown in FIG. 5, a second dry etching process is performed to etch the pad oxide layer 12 and the semiconductor substrate 10 by using the BSG film 16 as a hard mask film, thereby forming deep trenches 23.

However, as indicated by numeral 25 in FIG. 5, edge peeling is frequently observed in the interface between the BSG film 16 and the silicon nitride film 14 around the deep trenches 23. The peeling problems, which might lead to costly failure of deep trench pattern transfer, usually occur during the dry etching processes. One approach to solving the problem of peeling between the BSG film 16 and the underlying silicon nitride film 14 is to reduce the boron concentration of the BSG film 16 down to a value of below 5% in weight. Unfortunately, such a reduced boron concentration in the BSG film 16 will cause difficulty in removing the BSG film 16 in the follow-up cleaning procedures. As known by those skilled in the art, the higher the boron concentration in the BSG film 16 is, the easier the BSG film 16 can be removed in a wet cleaning procedure that employs a typical etching solution such as $H_2SO_4/HNO_3$ mixture.

Consequently, there is a strong need to provide a method that is capable of maintaining the boron concentration in the BSG film 16 at an acceptable level, while enhancing the adhesion strength of the BSG film 16 to the silicon nitride film 14. Further, according to the prior art deep trench process, no surface treatment is performed on the silicon nitride film 14 before the deposition of the BSG film 16.

SUMMARY OF INVENTION

It is therefore a primary objective of the claimed invention to provide a semiconductor manufacturing method that is able to enhance the adhesion strength of BSG film to silicon nitride film.

Another objective of the claimed invention is to provide a reliable deep trench process.

According to the claimed invention, a method is provided for enhancing adhesion strength of BSG film to silicon nitride film. A semiconductor substrate with a silicon nitride film formed thereon is provided. The silicon nitride film is then exposed to oxygen-containing plasma. A thick BSG film is then deposited onto the treated surface of the silicon nitride film. By pre-treating the silicon nitride film with the oxygen-containing plasma, the BSG film may have a boron concentration of between 5% and 8% in weight.

Further, the silicon nitride film may be formed by using LPCVD, plasma-enhanced CVD (PECVD), or high-density plasma CVD (HDPCVD). The oxygen-containing plasma comprises mixed gas plasma of ozone and oxygen, oxygen plasma, NO plasma, $N_2O$ plasma, or mixed gas plasma of ozone and inert gases.

These and other objectives of the claimed invention will no doubt become obvious to those of ordinary skill in the art after reading the following detailed description of the preferred embodiment, which is illustrated in the various figures and drawings.

Table 1 illustrates the Kapp values of BSG films obtained by a modified edge lift-off test.

DETAILED DESCRIPTION

Figure 1:
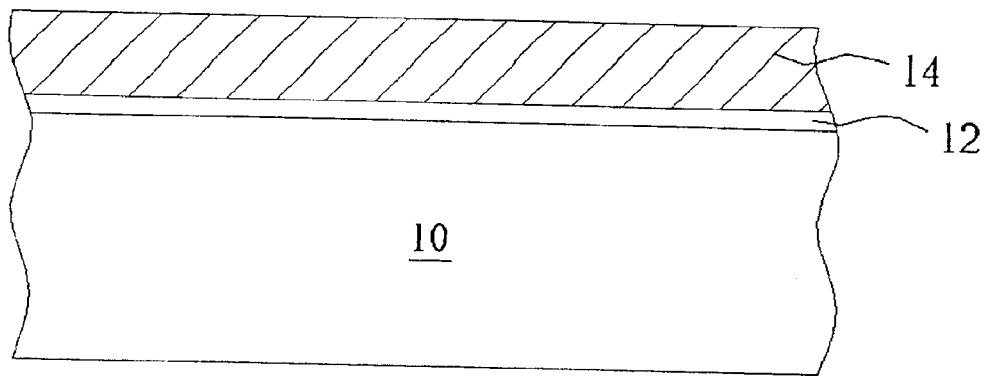
FIG. 1 to FIG. 5 are schematic diagrams depicting a prior art method of forming a deep trench on a semiconductor substrate.
Figure 2:
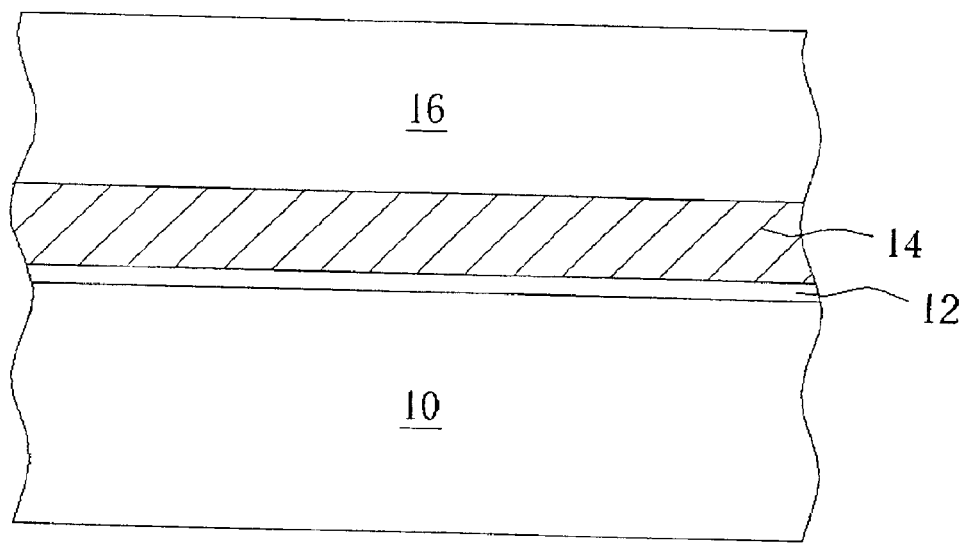
Figure 3:
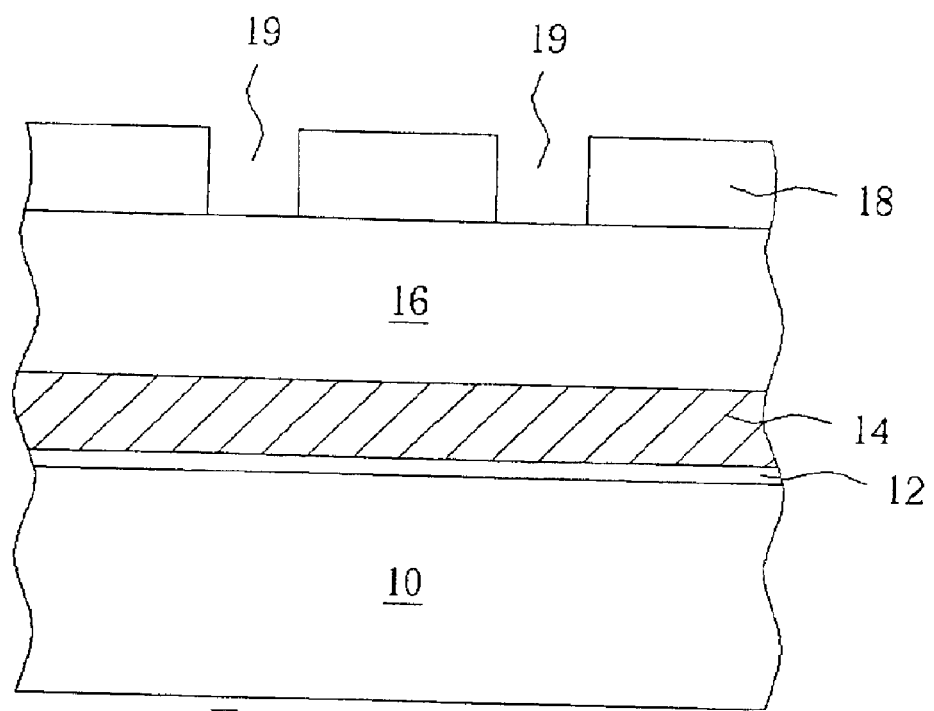
Figure 4:
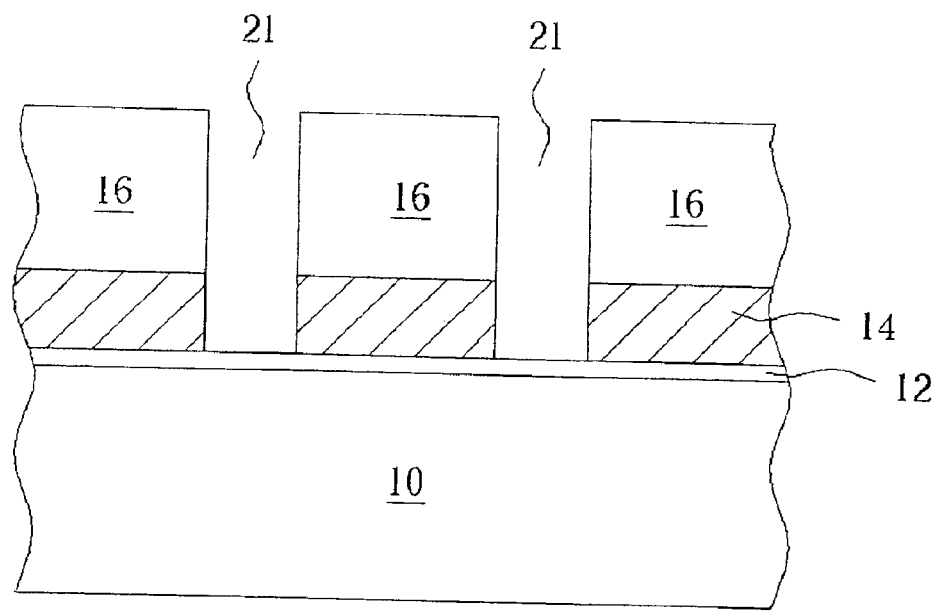
Figure 5:
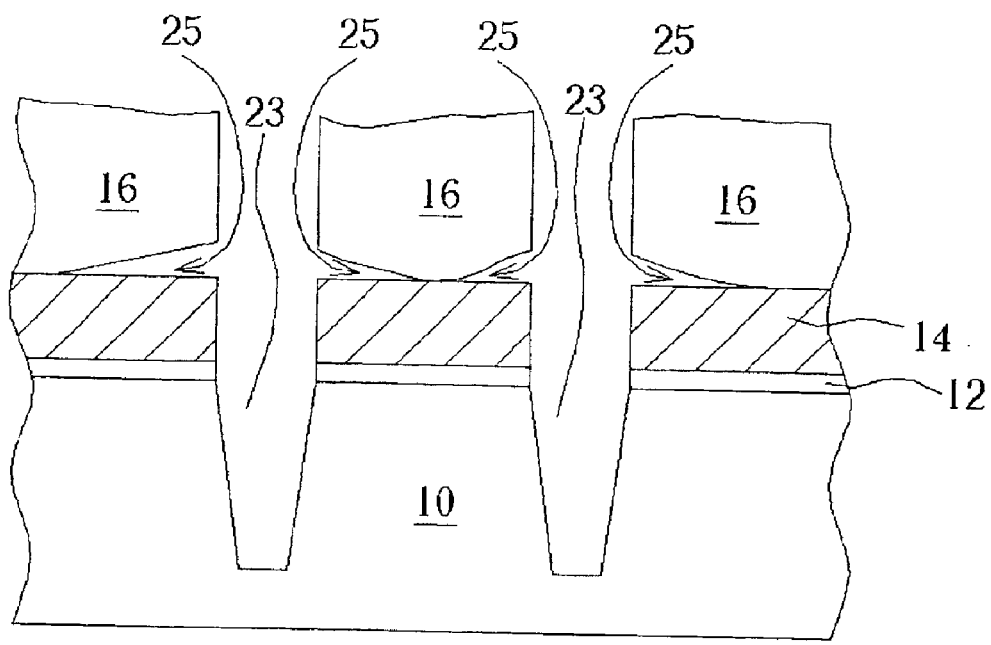
Figure 6:
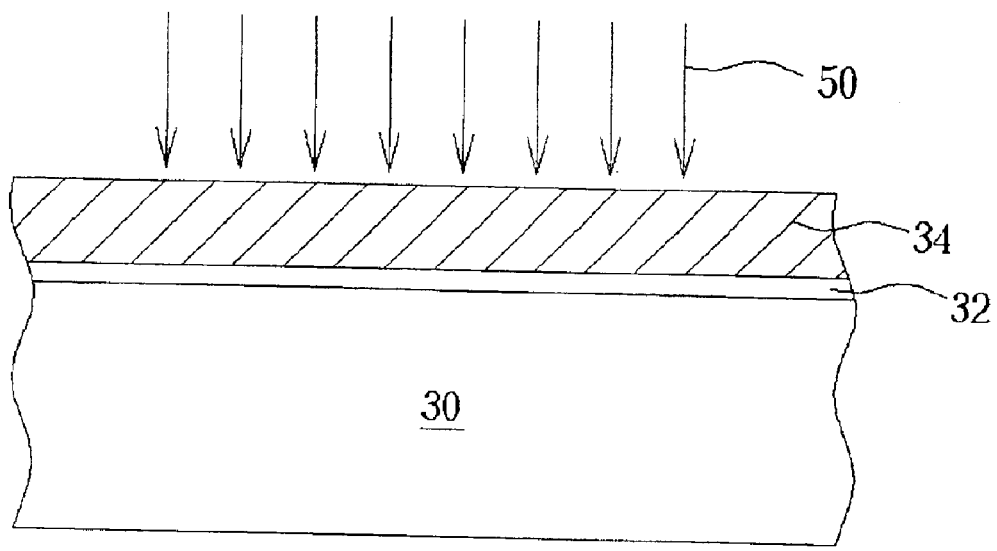
FIG. 6 and FIG. 7 are schematic diagrams showing a method of forming a deep trench on a semiconductor substrate according to the present invention.
Figure 7:
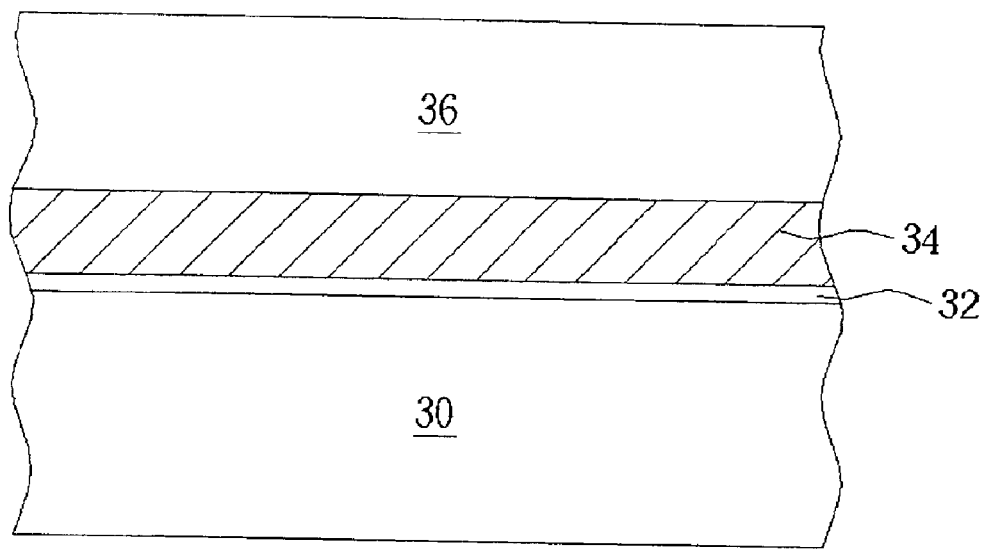

Please refer to FIG. 6 and FIG. 7. FIG. 6 and FIG. 7 are schematic diagrams showing a method of forming a deep trench on a semiconductor substrate according to the present invention. First, as shown in FIG. 6, a semiconductor substrate 30 having a pad oxide layer 32 and a silicon nitride film 34 formed thereon is provided. The silicon nitride film 34 may be formed by using low-pressure chemical vapor deposition (LPCVD), plasma-enhanced CVD (PECVD), or high-density plasma CVD (HDPCVD). Typically, the silicon nitride film 34 has a thickness of between 1000 angstroms and 2000 angstroms. In the preferred embodiment of this invention, the silicon nitride film 34 is formed by using LPCVD.

Still referring to FIG. 6, after depositing the silicon nitride film 34, a surface treatment step for the silicon nitride film 34 is carried out. The surface treatment step comprises using oxygen-containing plasma 50 to bombard the exposed surface of the silicon nitride film 34. The oxygen-containing plasma 50 comprises mixed gas plasma of ozone and oxygen plasma, NO plasma, $N_2O$ plasma, or mixed gas plasma of ozone and inert gases. According to the preferred embodiment of this invention, $O_3/O_2$ plasma that is created under a high frequency radio frequency (HFRF) of between 1 and 9 W/cm$^2$ is used to treat the surface of the silicon nitride film 34 for 5 seconds to 20 minutes. Preferably, the $O_3/O_2$ plasma has an ozone/oxygen concentration of about 2% to 50% in weight. As shown in FIG. 7, a thick BSG film 36 is deposited onto the pre-treated silicon nitride film 34. The BSG film 36 has a thickness of about 7,500 angstroms to 15,000 angstroms and a boron concentration of about 5.53% in weight. The remaining steps of forming a deep trench in the semiconductor substrate 30 are similar to the prior art processes and are therefore omitted hereinafter. It is advantageous that by pre-treating the silicon nitride film 34 with the oxygen-containing plasma 50, the BSG film 36 may have a boron concentration of up to 7% to 8% in weight without affecting the adhesion strength of the BSG film to silicon nitride film.

TABLE 1

| FILM CONDITIONS | Kapp (Mpa-m$^{1/2}$) |
| --- | --- |
| 13k BSG film (B% = 5.53% in weight) SiN film without surface treatment | 0.3101 |
| 13k BSG film (B% = 5.53% in weight) SiN film pre-treated with O$_3$ plasma (60 sec) | 0.4688 |

Please refer to table 1. Table 1 shows comparison of the Kapp values of BSG films obtained by a modified edge lift-off test. As shown in table 1, the Kapp values are obtained by testing the BSG films having a thickness of about 13,000 angstroms and a boron concentration of about 5.53% in weight. It is clear that by pre-treating the silicon nitride film with ozone plasma for about 60 seconds, an increase of near 50% of Kapp of the BSG film is obtained.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of enhancing adhesion strength of a borosilicate glass (BSG) film to a silicon nitride film, comprising:
   providing a semiconductor substrate having a silicon nitride film formed thereon;
   exposing the silicon nitride film to an oxygen-containing plasma; and
   depositing a BSG film on the silicon nitride film; wherein the BSG film has a boron concentration of between 5% and 8% in weight.

2. The method of claim 1 wherein the silicon nitride film is formed by using chemical vapor deposition (CVD), plasma-enhanced CVD (PECVD), or plasma CVD.

3. The method of claim 1 wherein the silicon nitride film has a thickness of about 1000 to 2000 angstroms.

4. The method of claim 1 wherein the BSG film has a boron concentration of about 5.53% in weight.

5. The method of claim 1 wherein the thickness of the BSG film is between 7,500 to 15,000 angstroms.

6. The method of claim 1 wherein the oxygen-containing plasma consists of ozone and oxygen having an ozone/oxygen concentration of about 2% to 50% in weight, and wherein the oxygen-containing plasma is created under a high frequency radio frequency (HFRF) of about 1 to 9 W/cm$^2$.

7. The method of claim 1 wherein the silicon nitride film is exposed to the oxygen-containing plasma for about 5 seconds to 20 minutes.

8. A method of manufacturing a trench on a substrate, comprising:
   providing a substrate;
   forming an oxide layer on the substrate;
   depositing a silicon nitride film over the oxide layer;
   exposing the silicon nitride film to an oxygen-containing plasma for a predetermined time period;
   depositing a BSG film over the silicon nitride film, wherein the BSG film has a boron concentration of between 5% and 8% in weight; and
   dry-etching the substrate to form a trench by using the BSG film as an etching mask.

9. The method of claim 8 wherein the silicon nitride film is formed by using chemical vapor deposition (CVD), plasma-enhanced CVD (PECVD), or plasma CVD.

10. The method of claim 8 wherein the silicon nitride film has a thickness of about 1000 to 2000 angstroms.

11. The method of claim 8 wherein the BSG film has a boron concentration of about 5.53% in weight.

12. The method of claim 8 wherein the thickness of the BSG film is between 7,500 to 15,000 angstroms.

13. The method of claim 8 wherein the oxygen-containing plasma consists of ozone and oxygen having an ozone/oxygen concentration of about 2% to 50% in weight, and wherein the oxygen-containing plasma is created under a high frequency radio frequency (HFRF) of about 1 to 9 W/cm$^2$.

14. The method of claim 8 wherein the predetermined time period is between 5 seconds and 20 minutes.

* * * * *